United States Patent
Muffoletto et al.

Patent Number: 6,096,391
Date of Patent: Aug. 1, 2000

[54] METHOD FOR IMPROVING ELECTRICAL CONDUCTIVITY OF METALS, METAL ALLOYS AND METAL OXIDES

[75] Inventors: Barry C. Muffoletto, Alden; Ashish Shah, East Amherst, both of N.Y.

[73] Assignee: Wilson Greatbatch Ltd., Clarence, N.Y.

[21] Appl. No.: 09/174,132

[22] Filed: Oct. 16, 1998

[51] Int. Cl.[7] .............................. H05H 1/48; B05D 5/12
[52] U.S. Cl. .................. 427/580; 427/81; 427/255.4; 427/255.7
[58] Field of Search .................. 427/580, 81, 255.4, 427/255.7

[56] References Cited

U.S. PATENT DOCUMENTS

| | | | |
|---|---|---|---|
| 4,351,855 | 9/1982 | Pinkhasov | 427/37 |
| 4,438,153 | 3/1984 | Pinkhasov | 427/37 |
| 4,569,719 | 2/1986 | Coleman | 156/643 |
| 4,609,564 | 9/1986 | Pinkhasov | 427/37 |
| 4,942,844 | 7/1990 | Pinkhasov | 118/723 |
| 4,975,230 | 12/1990 | Pinkhasov | 264/59 |
| 4,978,556 | 12/1990 | Pinkhasov | 427/37 |
| 5,011,638 | 4/1991 | Pinkhasov | 264/59 |
| 5,098,485 | 3/1992 | Evans | 148/272 |
| 5,269,898 | 12/1993 | Welty | 204/298 |

*Primary Examiner*—Roy V. King
*Attorney, Agent, or Firm*—Hodgson, Russ, Andrews, Woods & Goodyear LLP

[57] ABSTRACT

A method for improving the electrical conductivity of a substrate of metal, metal alloy or metal oxide comprising depositing a small or minor amount of metal or metals from Group VIIIA metals (Fe, Ru, Os, Co, Rh, Ir, Ni, Pd, Pt) or from Group IA metals (Cu, Ag, Au) on a substrate of metal, metal alloys and/or metal oxide from Group IVA metals (Ti, Zr, Hf), Group VA metals (V, Nb, Ta), Group VIA metals (Cr, Mo, W) and Al, Mn, Ni and Cu. The native oxide layer of the substrate is changed from electrically insulating to electrically conductive. The step of depositing is carried out by a low temperature arc vapor deposition process. The deposition may be performed on either treated or untreated substrate. The substrate with native oxide layer made electrically conductive is useable in the manufacture of electrodes for devices such as capacitors and batteries.

5 Claims, 5 Drawing Sheets

METHOD FOR IMPROVING ELECTRICAL CONDUCTIVITY OF METALS, METAL ALLOYS AND METAL OXIDES

BACKGROUND OF THE INVENTION

This invention relates to the art of treating metals, metal alloys and metal oxides, and more particularly to a new and improved method for enhancing the electrical conductivity of metals, metal alloys and metal oxides.

One area of use of the present invention is in the manufacturing of electrodes for capacitors, batteries and the like, although the principles of the present invention can be variously applied. Metals and metal alloys have a native oxide present on the surface. This is an insulating layer and hence if the material is to be used as a substrate for an electrode, the oxide has to be removed or made electrically conductive.

If the oxide is removed by chemical treatment, such as by etching with an acid or electrolytic etching to expose the underlying metal, special steps must be taken in order to complete the electrical contacts before the native oxide can be regenerated and interfere with the electrical contacts. Such measures require special apparatus and extremely careful handling of the materials, all of which adds cost to the fabricating of electrical devices incorporating these materials to which electrical contact must be made. Another approach involves removing the oxide layer and plating the bare substrate metal with an expensive noble metal, such as silver, gold, or alloys of silver, gold and platinum, or the formation of an electrically conducting compound on the bare substrate surface. The materials employed are expensive and the steps required to plate the substrate are costly and time consuming. In addition, the metal plating or electrically conducting compound must be disposed on the substrate as a continuous film for maximum performance. Therefore, the plating or compound formation typically is carried out after the substrate metal is formed into its final shape for the electrical device in which it is incorporated in order to avoid damage to the coating. This, in turn, adds to the cost and complexity of the manufacturing process.

U.S. Pat. No. 5,098,485 issued Mar. 24, 1992 to David A. Evans proposes a solution to the oxide problem by altering the native oxide from an electrically insulating to an electrically conducting condition without removal of the native oxide layer to expose the underlying metal or alloy. A solution containing ions of an electrical material is applied to the native oxide layer, and then the substrate, oxide and applied ions are heated to an elevated temperature for a time sufficient to incorporate the ions into the oxide layer to change it from an electrical insulator to an electrical conductor.

SUMMARY OF THE INVENTION

It would therefore, be highly desirable to provide a new and improved method for enhancing the electrical conductivity of metals, metal alloys and metal oxides which does not require additional heat treatment, which provides control over the density and depth of the material introduced to the treated surface, which can be performed in a manner preventing substrate degradation and deformation, and which improves the quality of the treated surface.

The present invention provides a method for improving the electrical conductivity of a substrate of metal, metal alloy or metal oxide which includes depositing a small or minor amount of metal or metals from Group VIIIA metals (Fe, Ru, Os, Co, Rh, Ir, Ni, Pd, Pt) or from Group IA metals (Cu, Ag, Au) on a substrate of metal, metal alloys and/or metal oxide from Group IVA metals (Ti, Zr, Hf), Group VA metals (V, Nb, Ta), Group VIA metals (Cr, Mo, W) and Al, Mn, Ni and Cu. The native oxide layer is changed from electrically insulating to electric ally conductive. The depositing process is a low temperature arc vapor deposition process. This may be done in a deposition chamber. The deposition may be performed on either treated or untreated substrate. After deposition the substrate is available for use as a substrate and no other processing steps may be necessary.

The method of the present invention advantageously does not require additional heat treatment and provides control over the density and depth of the material introduced onto the treated surface thereby not affecting the bulk of the material. The method can be performed at a temperature sufficiently low so as to prevent substrate degradation and deformation. It is believed that the quality of the treated surface is improved by the method of the present invention. Multiple processing steps may be incorporated into the method, for example substrate cleaning, oxide removal and etching. Another advantage is that using a substrate treated by the method of the present invention will allow the surface thereof to be treated to passivate it from chemical reaction while still providing adequate electrical conductivity. Stainless steels having native insulating oxide layers also can be treated by the method of the present invention to provide an electrically conductive oxide layer.

A substrate treated by the method of the present invention is ready for further processing in the manufacture of an electrode for use in capacitors, batteries and the like. Typically, in the case of a capacitor, an appropriate electrode material is deposited on the substrate treated surf ace by techniques well-known to those skilled in the art. Examples of electrode materials are redox pseudo capacitance materials such as, but not limited to, oxides and mixed oxides of ruthenium, iridium, manganese, nickel, cobalt, tungsten, niobium, iron, molybdenum or double layer materials or under potential deposition materials such as palladium, platinum, lead dioxide or electro-active conducting polymers such as polyaniline, polypyrole and polythiophene.

The foregoing and additional advantages and characterizing features of the present invention will become clearly apparent upon a reading of the ensuing detailed description together with the included drawing wherein:

BRIEF DESCRIPTION OF THE DRAWING FIGURES

DETAILED DESCRIPTION OF THE ILLUSTRATED EMBODIMENT

Figure 1:
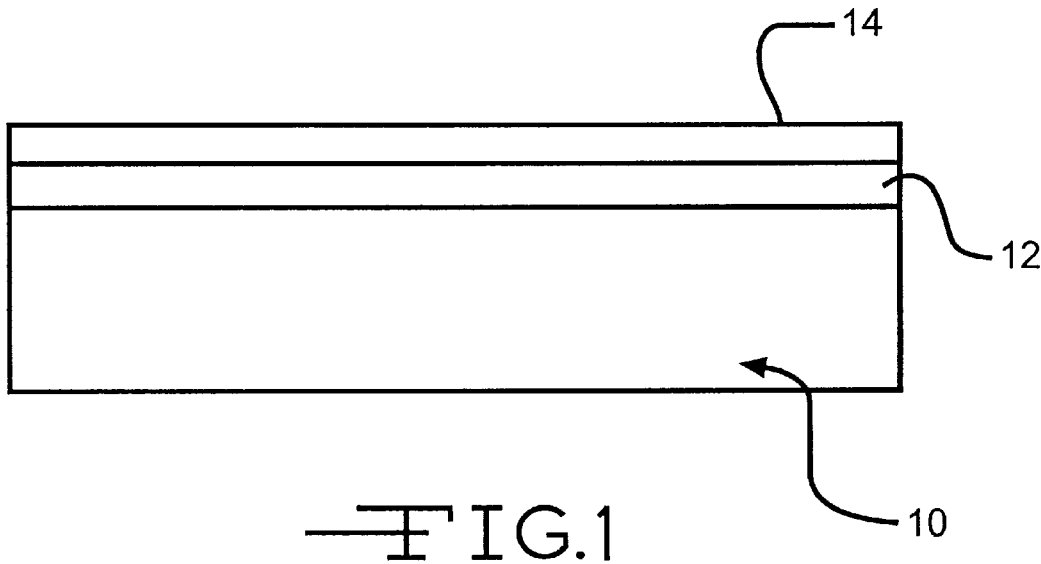
FIG. 1 is a diagrammatic view illustrating the method of the present invention at one stage thereof.

Metals and metal alloys have a native oxide present on the surface which is electrically insulating and must be removed or made electrically conductive if the metal or metal alloy is to be used as an electrode in devices such as capacitors and batteries. Referring to FIG. 1 there is shown a substrate 10 having an electrically insulating native oxide layer 12 on a surface thereof. In accordance with the present invention, oxide layer 12 is made more electrically conductive, i.e. changed from electrically insulating to electrically conductive. Substrates treated by the method of the present invention include metals and alloys thereof selected from the group consisting of Group IVA metals (Ti, Zr, Hf), Group VA metals (V, Nb, Ta), Group VIA metals (Cr, Mo, W), aluminum, manganese, nickel, copper and stainless steel. They typically have a thickness in the range from about 0.001 mm. to about 2.0 mm.

Figure 2:
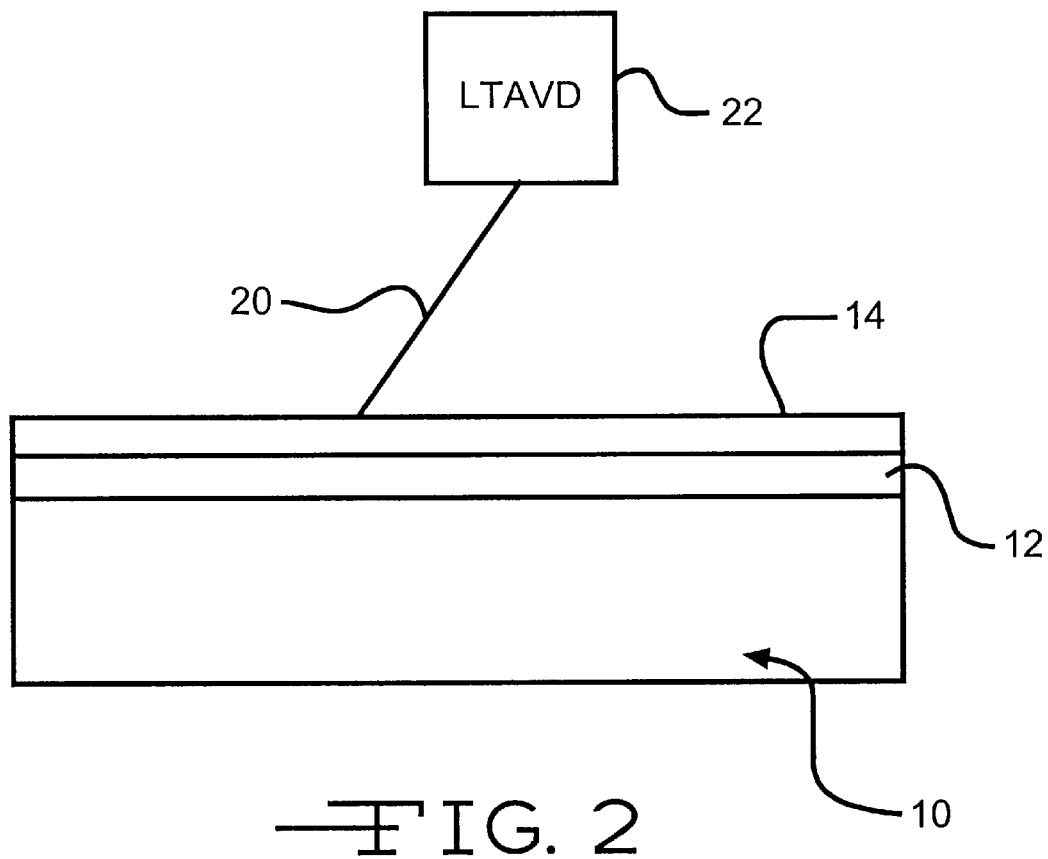
FIG. 2 is a diagrammatic view illustrating the method of the present invention at another stage thereof.

In accordance with the present invention, a layer 14 is deposited on the native oxide layer 12 wherein the layer 14 is a small amount of metal or metals selected from the group consisting of Group IA metals (Cu, Ag, Au) and Group VIIIA metals (Fe, Ru, Os, Co, Rh, Ir, Ni, Pd, Pt). The layer 14 is deposited by a low temperature arc vapor deposition process (LTAVD). As shown in FIG. 2, the process represented diagrammatically by dotted line 20 is carried out by apparatus 22. The deposition may be performed on either treated or untreated substrate, and the deposition may or may not be preceded by removal of the oxide from the substrate. This may be done in the deposition chamber of apparatus 22. The native oxide layer 12 is changed from electrically resistive to electrically conductive. After deposition the substrate is available for use as a substrate and no other processing steps may be necessary.

Figure 3:
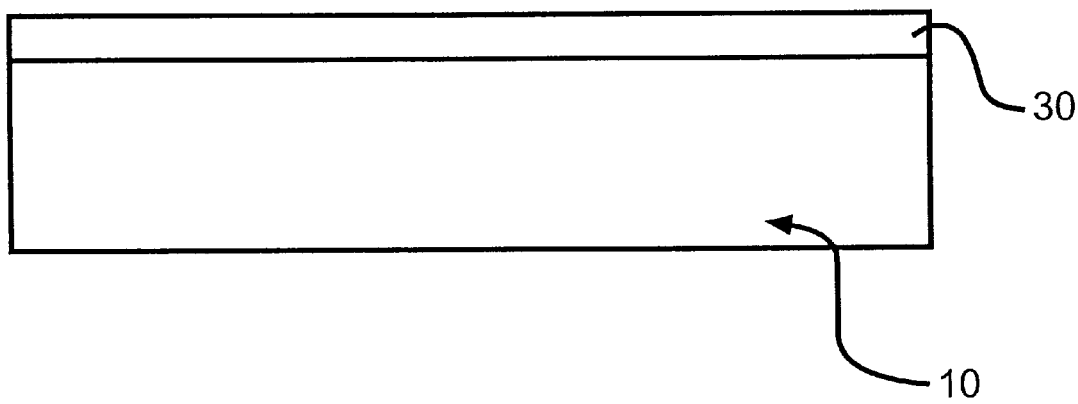
FIG. 3 is a diagrammatic view of a substrate after treatment by the method of the present invention.

The depositing of metal 14 on native oxide layer 12 by means of the low temperature arc vapor deposition process 20 converts the electrically insulating native oxide layer 12 to a mixed layer 30 on substrate 10 as shown in FIG. 3 which mixed layer 30 has a degree of electrical conductivity sufficient to make substrate 10 useable as an electrode in a device such as a capacitor or battery. In other words, native oxide layer 12 has been converted from being essentially non-conductive, i.e. insulating, to having an increased and improved degree of electrical conductivity. Thus, the quality of the treated surface of substrate 10 is improved in that the surface layer 12 is changed from an insulating, semiconducting or dielectric state to an electrically conducting state.

Figure 4:
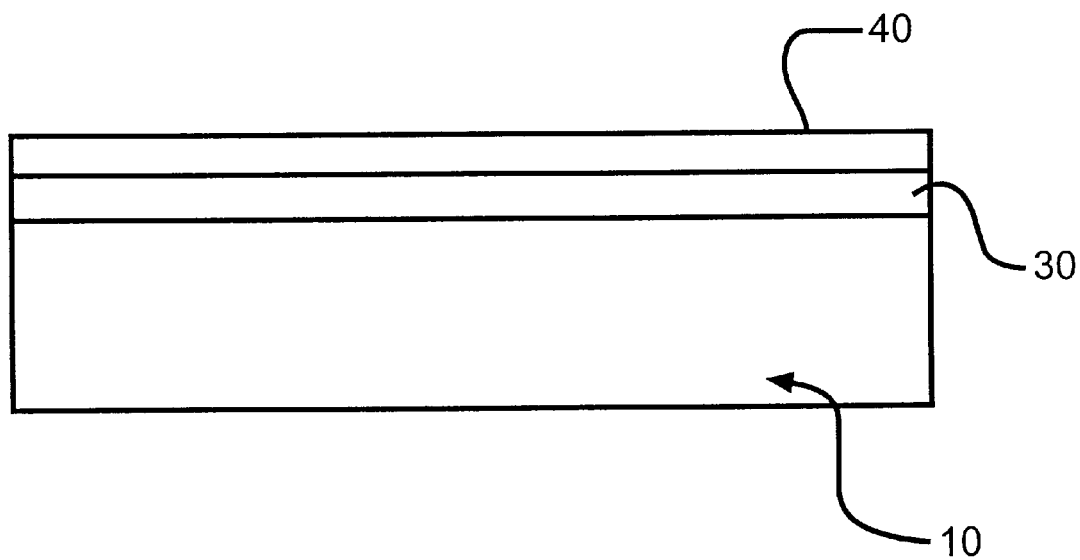
FIG. 4 is a diagrammatic view of the substrate of FIG. 3 having electrode material deposited thereon for use in manufacture of a capacitor electrode.

The substrate shown in FIG. 3, treated by the method of the present invention, is ready for further processing in the manufacture of an electrode for use in capacitors, batteries and the like. Typically, in the case of a capacitor, an appropriate electrode material 40 as shown in FIG. 4 is deposited on the substrate treated surface by techniques well-known to those skilled in the art. Examples of electrode material 40 are redox pseudo capacitance materials such as, but not limited to, oxides and mixed oxides of ruthenium, iridium, manganese, nickel, cobalt, tungsten, niobium, iron, molybdenum, or under potential deposition systems such as palladium, platinum, lead dioxide or electro-active conducting polymers such as polyaniline, polypyrole, and polythiophene.

The present invention is illustrated further by the following example.

EXAMPLE

A tantalum or titanium substrate similar to substrate 10 shown in FIG. 1 is first abraded on one side using a 3M Scotch-brite pad of very fine type. This produces a rough surface on the side to be coated. It is then degreased and cleaned. This is accomplished by cleaning the foil in an ultrasonic bath using acetone as a solvent for 10 minutes. Next it is washed in an ultrasonic methanol bath and then blow dried using dry, clean compressed air.

The substrate is now ready to be coated with palladium. It is placed in a Low Temperature Arc Vapor Deposition (LTAVD) apparatus similar to apparatus 22 of FIG. 2 to be coated. After the sample is loaded into the apparatus the pressue in the deposition chamber is lowered by a vacuum pump to $10^{-5}$–$10^{-6}$ Torr. This gets rid of all waste gases, specially oxygen. In this process oxygen is a contaminant. The pressue is brought up to the mTorr range by introducing argon into the chamber. The substrate is biased to 600V and an arc is struck. This arc is now used to remove the native oxide layer on the tantalum. On completion of the oxide removal the bias voltage is reduced to 50–100V. The palladium is evaporated, by the arc, from the electrode and coats the substrate. The coating thickness is about 0.1 micron. After the deposition is complete the chamber is back filled with argon and brought back to atmospheric pressure. The substrate is now ready to be coated with ruthenium oxide, as the coating provides good electrical contact to the bulk tantalum, for use in making a capacitor electrode.

Figure 5:
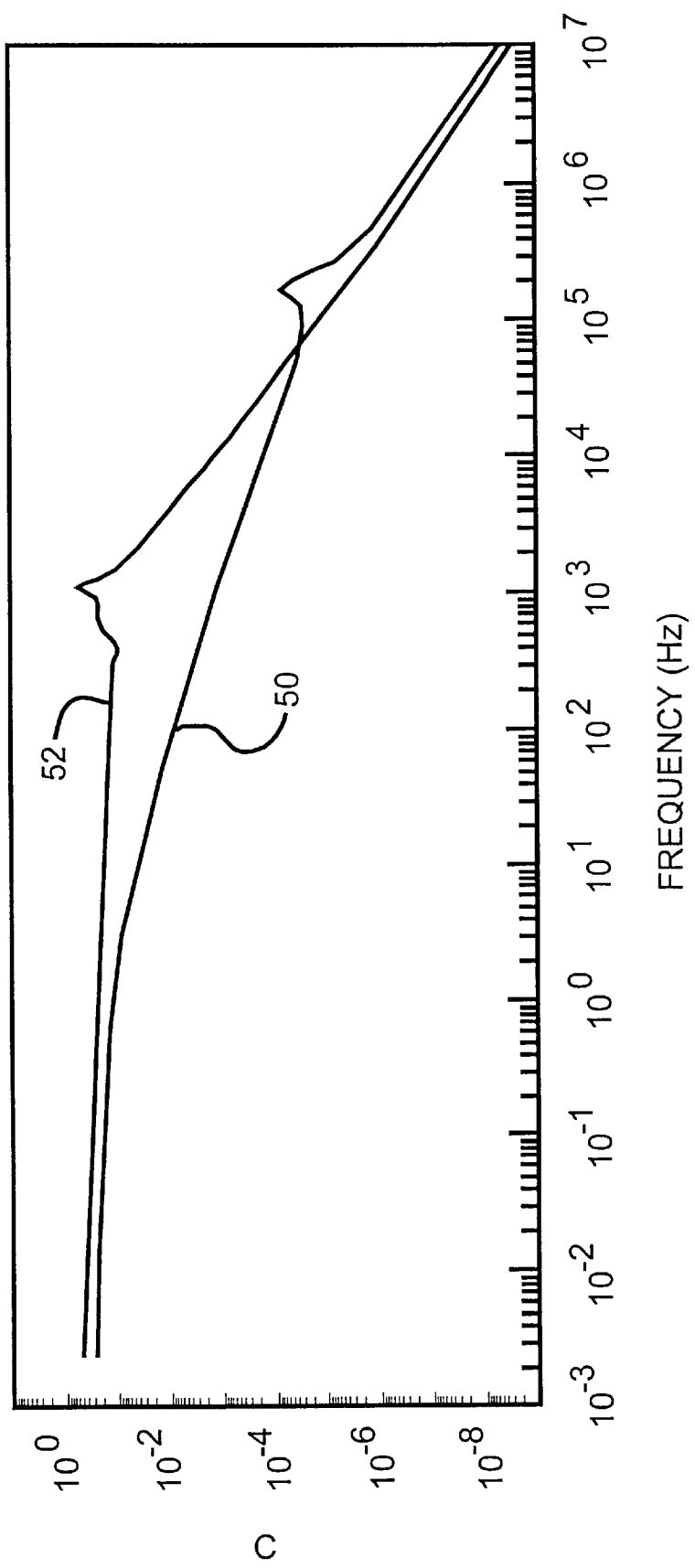
FIGS. 5–7 are graphs depicting impedance spectroscopy scans on substrates of the type shown in FIG. 4.
Figure 6:
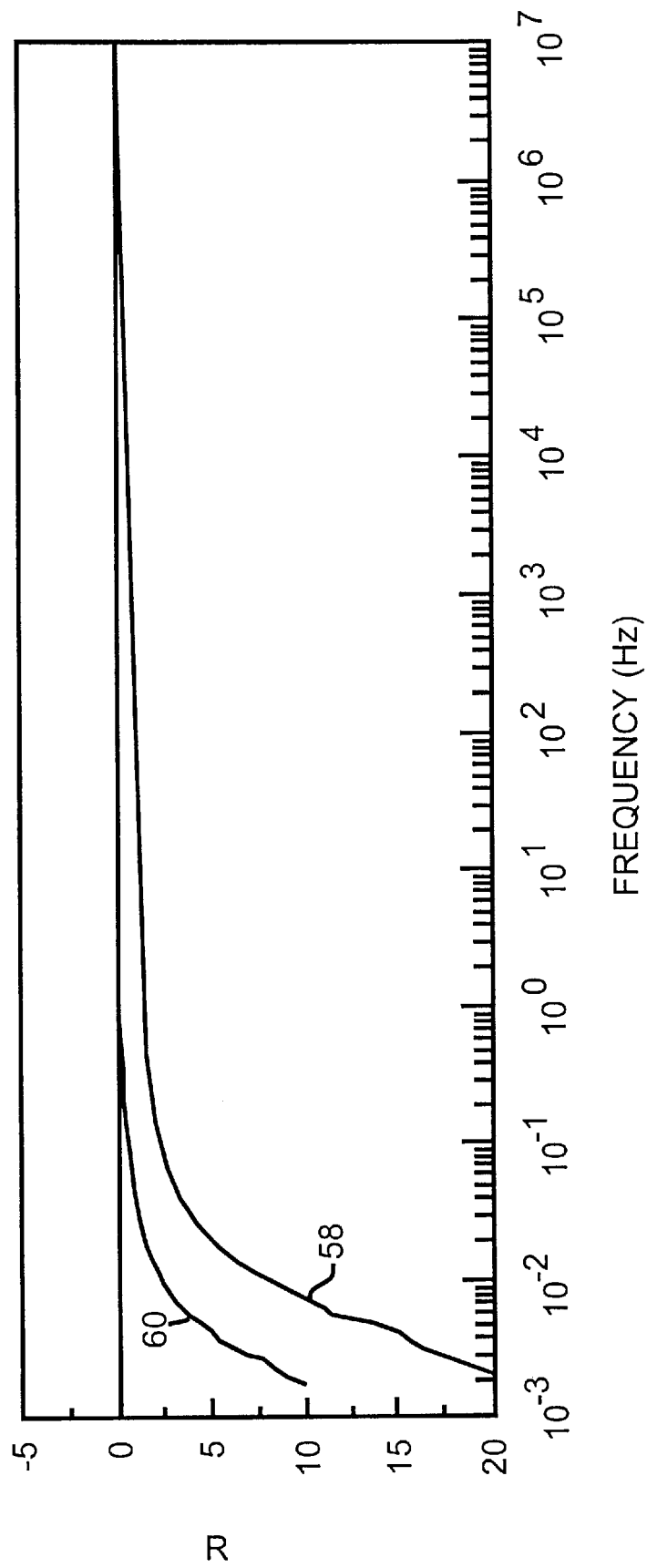
Figure 7:
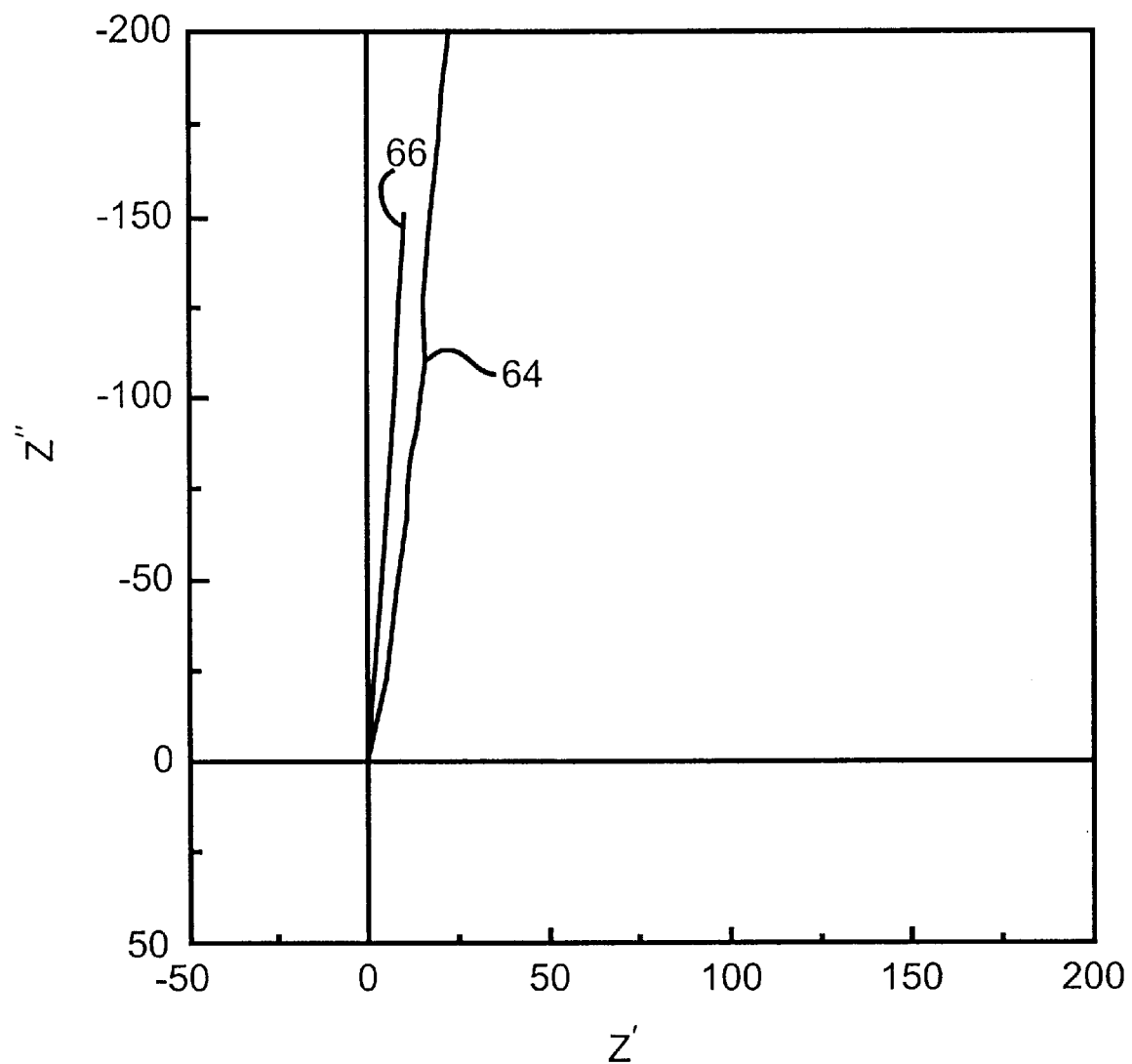

FIGS. 5–7 depict impedance spectroscopy scans on substrates treated according to the present invention and coated with ruthenium oxide for use as capacitor electrodes. FIG. 5 compares the capacitance of the ruthenium oxide coating on bare tantalum to capacitance of the ruthenium oxide coating on tantalum treated according to the present invention. Curve 50 in FIG. 5 is for bare or unprocessed tantalum, and curve 52 is for tantalum treated according to the present invention by the LTAVD process 20. The relatively lower capacitance of the untreated tantalum is due to the presence of the insulating native oxide.

FIG. 6 compares the resistance of the ruthenium oxide coating on bare tantalum to resistance of the ruthenium oxide coating on tantalum treated according to the present invention. Curve 58 in FIG. 6 is for bare or untreated tantalum, and curve 60 is for tantalum processed according to the present invention using the LTAVD process 20. The relatively higher resistance of the untreated tantalum at the lower end of the frequency spectrum is due to the presence of the insulating native oxide. FIG. 7 shows the coating behavior with unprocessed tantalum in curve 64, and tantalum processed according to the present invention in curve 66, using LTAVD process 20.

Table I presents additional capacitance and resistance data from FIGS. 6 and 7 comparing untreated tantalum with a ruthenium oxide coating to ruthenium oxide coated tantalum treated according to the present invention using the LTAVD process 20.

TABLE I

| Tantalum Material | Cs | Rs |
|---|---|---|
| Pure Tantalum coated with Ru Oxide | 22.30 mF/sq in | 521.26 m ohm |
| Tantalum-LTAVD process coated with Ru Oxide | 473.38 mF/sq in | 28.56 m ohm |

It is therefore apparent that the present invention accomplishes its intended objects. While embodiments of the present invention have been described in detail, that is for the purpose of illustration, not limitation.

What is claimed is:

1. A method of improving electrical conductivity of metals, metal alloys and metal oxides comprising:

a) providing a substrate having an electrically insulating native oxide layer on a surface thereof, said substrate being selected from the group consisting of Group IVA, Group VA and Group VIA metals, aluminum, manganese, nickel, copper and stainless steel; and b) utilizing a low temperature arc vapor deposition process to deposit on said native oxide layer a metal selected from the group consisting of Group IA and Group VIIIA metals;

c) whereby said native oxide layer is changed from being electrically insulating to being more electrically conductive.

2. A method according to claim 1, including sequentially depositing and intermixing until a predetermined mixing depth is obtained.

3. A method according to claim 1, further including applying a coating on said native oxide layer whereby said substrate is useable as an electrode in a capacitor.

4. A method of improving electrical conductivity of metals, metal alloys and metal oxides comprising:

a) providing a substrate having an electrically insulating native oxide layer on a surface thereof, said substrate being of a material operative for use as an electrode in a capacitor; and b) utilizing a low temperature arc vapor deposition process to deposit on said substrate surface a metal selected from the group consisting of Group IA and Group VIIIA metals;

c) whereby said native oxide layer is changed from being electrically insulating to being more electrically conductive.

5. A method according to claim 4, further including applying a coating of capacitor electrode material on said native oxide layer.

* * * * *